US012613455B2

(12) United States Patent
Ayukawa et al.

(10) Patent No.: US 12,613,455 B2
(45) Date of Patent: Apr. 28, 2026

(54) LENS DRIVE DEVICE, AND LENS BARREL AND CAMERA EQUIPPED WITH SAME

(71) Applicant: Panasonic Intellectual Property Management Co., Ltd., Osaka (JP)

(72) Inventors: Shuhei Ayukawa, Osaka (JP); Makoto Umeda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 553 days.

(21) Appl. No.: 18/098,381

(22) Filed: Jan. 18, 2023

(65) Prior Publication Data

US 2023/0350275 A1 Nov. 2, 2023

(30) Foreign Application Priority Data

Apr. 28, 2022 (JP) ................................. 2022-074017

(51) Int. Cl.
| | |
|---|---|
| *G03B 17/14* | (2021.01) |
| *G03B 5/00* | (2021.01) |
| *H02K 41/035* | (2006.01) |
| *H05K 1/189* | (2026.01) |

(52) U.S. Cl.
CPC .............. *G03B 17/14* (2013.01); *G03B 5/00* (2013.01); *H02K 41/0354* (2013.01); *H05K 1/189* (2013.01); *G03B 2205/0069* (2013.01)

(58) Field of Classification Search
None
See application file for complete search history.

(56) References Cited

U.S. PATENT DOCUMENTS

| | | | | |
|---|---|---|---|---|
| 6,134,057 | A | * | 10/2000 | Ueyama ................. G02B 7/102 |
| | | | | 359/821 |
| 7,777,978 | B2 | | 8/2010 | Sato |
| 2008/0144198 | A1 | | 6/2008 | Sato |
| 2021/0373353 | A1 | | 12/2021 | Hagiwara |

FOREIGN PATENT DOCUMENTS

| | | | | | |
|---|---|---|---|---|---|
| JP | | H0694961 A | * | 4/1994 | |
| JP | | H08-29657 A | | 2/1996 | |
| JP | | H0875974 A | * | 3/1996 | |
| JP | | H08179184 A | * | 7/1996 | ............... G02B 7/08 |

(Continued)

OTHER PUBLICATIONS

Notice of Reasons for Refusal issued Dec. 23, 2025, for Japan Patent Application No. 2022-074017, with Machine Translation.

*Primary Examiner* — Rodney E Fuller
(74) *Attorney, Agent, or Firm* — Renner, Otto, Boisselle & Sklar, LLP

(57) ABSTRACT

The lens drive device comprises a voice coil motor, a focus lens unit 13, a main shaft 15a, an insertion hole 13ba, and a screw 30. The main shaft 15a guides the focus lens unit 13 in its movement in the optical axis direction. The insertion hole 13ba is provided in the focus lens unit 13, and the main shaft 15a is inserted therein. The screw 30 is provided to the focus lens unit 13, and suppresses looseness that occurs between the insertion hole 13ba and the main shaft 15a by being attracted in a specific direction together with the focus lens unit 13 by the magnetic force of the magnet 22 of the voice coil motor 20. The voice coil motor 20 is disposed below the position where the screw 30 is provided in the focus lens unit 13 in the vertical direction.

14 Claims, 9 Drawing Sheets

(56)　　　　　　References Cited

FOREIGN PATENT DOCUMENTS

| | | | | | |
|---|---|---|---|---|---|
| JP | H11305277 | A | * | 11/1999 | .............. G03B 5/00 |
| JP | 2004-271789 | A | | 9/2004 | |
| JP | 2004-280951 | A | | 10/2004 | |
| JP | 2005-107008 | A | | 4/2005 | |
| JP | 2006201593 | A | * | 8/2006 | |
| JP | 2007033541 | A | * | 2/2007 | |
| JP | 2007304214 | A | * | 11/2007 | |
| JP | 2008-151988 | A | | 7/2008 | |
| JP | 4804325 | B2 | | 11/2011 | |
| WO | WO-2014208195 | A1 | * | 12/2014 | .............. G02B 7/08 |
| WO | WO-2022201702 | A1 | * | 9/2022 | .............. G02B 7/04 |

* cited by examiner

LENS DRIVE DEVICE, AND LENS BARREL AND CAMERA EQUIPPED WITH SAME

CROSS-REFERENCE TO RELATED APPLICATIONS

This application claims priority to Japanese Patent Application No. 2022-074017 filed on Apr. 28, 2022. The entire disclosure of Japanese Patent Application No. 2022-074017 is hereby incorporated herein by reference.

BACKGROUND

Technical Field

The present disclosure relates to a lens drive device that drives a lens drive frame, which holds a lens, in the optical axis direction, and to a lens barrel and a camera equipped with this lens drive device.

Description of the Related Art

In recent years, a mechanism for driving a lens drive frame holding a lens back and forth in the optical axis direction has been used in digital cameras, digital video cameras, and other such optical equipment.

For example, Patent Literature 1 discloses a configuration of a lens barrel having a lens holding member that holds a lens and a voice coil motor that drives the lens holding member along a guide member in order to reduce fitting looseness of the lens barrel and improve precision, wherein a magnetic member is fixed to the lens holding member, and the lens holding member is moved in one direction with respect to the guide member by using a magnetic attraction force acting between the magnetic member and the magnet of the voice coil motor.

CITATION LIST

Patent Literature

Patent Literature 1: JP-A 2008-151988

SUMMARY

Problem to be Solved by the Disclosure

However, the following problems are encountered with the above-mentioned conventional lens barrel.

With the lens barrel disclosed in the above-mentioned publication, looseness can be suppressed to some extent by moving the lens holding member in one direction with respect to the guide member. However, with the above lens barrel, since the voice coil motor is disposed in the upper part, the magnetic material has to be disposed on the outer peripheral side of the lens barrel in order to make the directions of the biasing force and the gravitational force substantially match. Therefore, the lens barrel becomes larger in the radial direction, which is contrary to the goal of making the lens barrel more compact.

It is an object of the present disclosure to provide a lens drive device with which looseness of a lens drive frame can be suppressed without making the lens barrel larger, as well as a lens barrel and a camera equipped with this lens drive device.

Means for Solving Problem

The lens drive device according to the present disclosure comprises an electromagnetic drive mechanism, a lens drive frame, a first guide shaft, a first shaft support portion, and a magnetic material. The electromagnetic drive mechanism has a magnet and an electromagnetic coil disposed to be able to move in a state of being able to move relative to the magnet. The lens drive frame holds the lens, is fitted with an electromagnetic coil, and is driven back and forth in the optical axis direction of the lens by the electromagnetic drive mechanism. The first guide shaft is disposed along the optical axis direction of the lens and guides the lens drive frame in its movement in the optical axis direction. The first shaft support portion is provided to the lens drive frame, and the first guide shaft is inserted therein. The magnetic material is provided to the lens drive frame, and suppresses looseness of the lens drive frame that occurs between the first shaft support portion and the first guide shaft by being attracted together with the lens drive frame in a specific direction by the magnetic force of the magnet. The electromagnetic drive mechanism is disposed below the position where the magnetic material is provided to the lens drive frame, in the vertical direction.

Also, the lens drive device according to the present disclosure comprises an electromagnetic drive mechanism, a lens drive frame, a first guide shaft, a first shaft support portion, a magnetic material, and a flexible printed circuit board. The electromagnetic drive mechanism has a magnet and an electromagnetic coil disposed in a state of being able to move relative to the magnet. The lens drive frame holds the lens, is fitted with an electromagnetic coil, and is driven back and forth in the optical axis direction of the lens by the electromagnetic drive mechanism. The first guide shaft is disposed along the optical axis direction of the lens and guides the lens drive frame in its movement in the optical axis direction. The first shaft support portion is provided to the lens drive frame, and the first guide shaft is inserted therein. The flexible printed circuit board is connected to the electromagnetic drive mechanism and supplies electric power to the electromagnetic coil, is disposed on the opposite side of the electromagnetic drive mechanism so as to sandwich the first guide shaft, and exerts a biasing force inward in the radial direction centered on the optical axis of the lens. Upon receiving the biasing force, the lens drive frame is biased downward, in the vertical direction, in a tangential direction of a circle centered on the first guide shaft, and substantially parallel to the vertical direction.

Effects

With the lens drive device according to the present disclosure, it is possible to suppress looseness of the lens drive frame without increasing the size of the lens barrel.

DETAILED DESCRIPTION OF THE EMBODIMENT

Embodiments will now be described in detail with reference to the drawings as needed. However, some unnecessarily detailed description may be omitted. For example, detailed description of already known facts or redundant description of components that are substantially the same may be omitted. This is to avoid unnecessary repetition in the following description, and facilitate an understanding on the part of a person skilled in the art.

The applicant has provided the appended drawings and the following description so that a person skilled in the art might fully understand this disclosure, but does not intend for these to limit what is discussed in the patent claims.

Embodiment 1

The lens drive device according to an embodiment of the present disclosure, and a lens barrel 10 and a camera 100 equipped with this lens drive device will now be described with reference to FIGS. 1 to 8.

(1) Configuration of Lens Barrel 10

Figure 1:
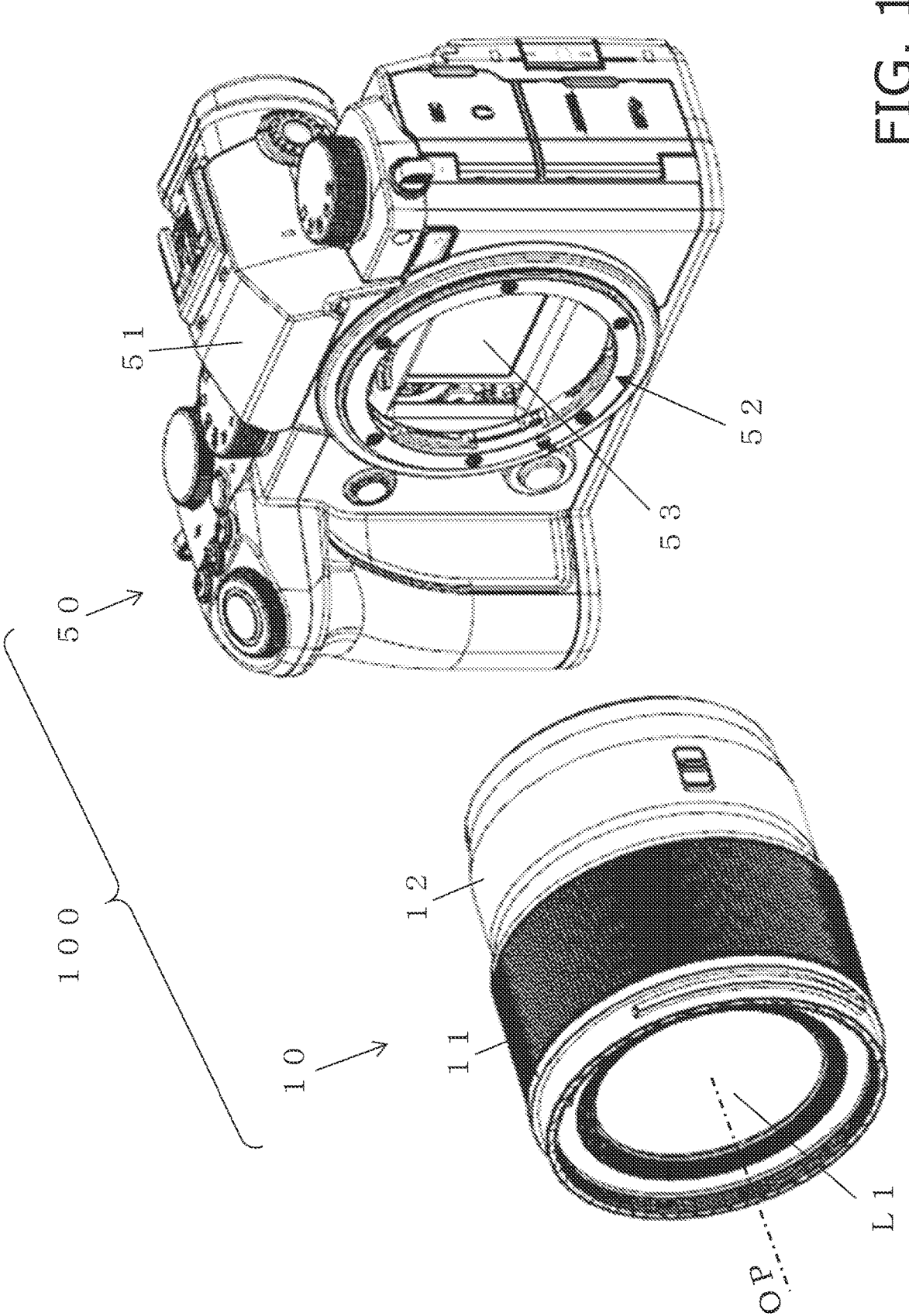
FIG. 1 is a diagram of the configuration of an entire camera, including a lens barrel equipped with the lens drive device according to an embodiment of the present disclosure, and a camera main body.

As shown in FIG. 1, the lens barrel 10 according to this embodiment is removably attached to a camera main body 50 (a mounting portion 52 provided on the subject side of a main body portion 51), for use as the camera 100. The lens barrel 10 encompasses a plurality of lenses, and light that is incident from the subject side in the optical axis OP direction of the lenses is guided to an image sensor 53 built into the main body portion 51 of the camera main body 50, so that a subject image is captured by the image sensor 53 and an image signal is generated.

Figure 2:
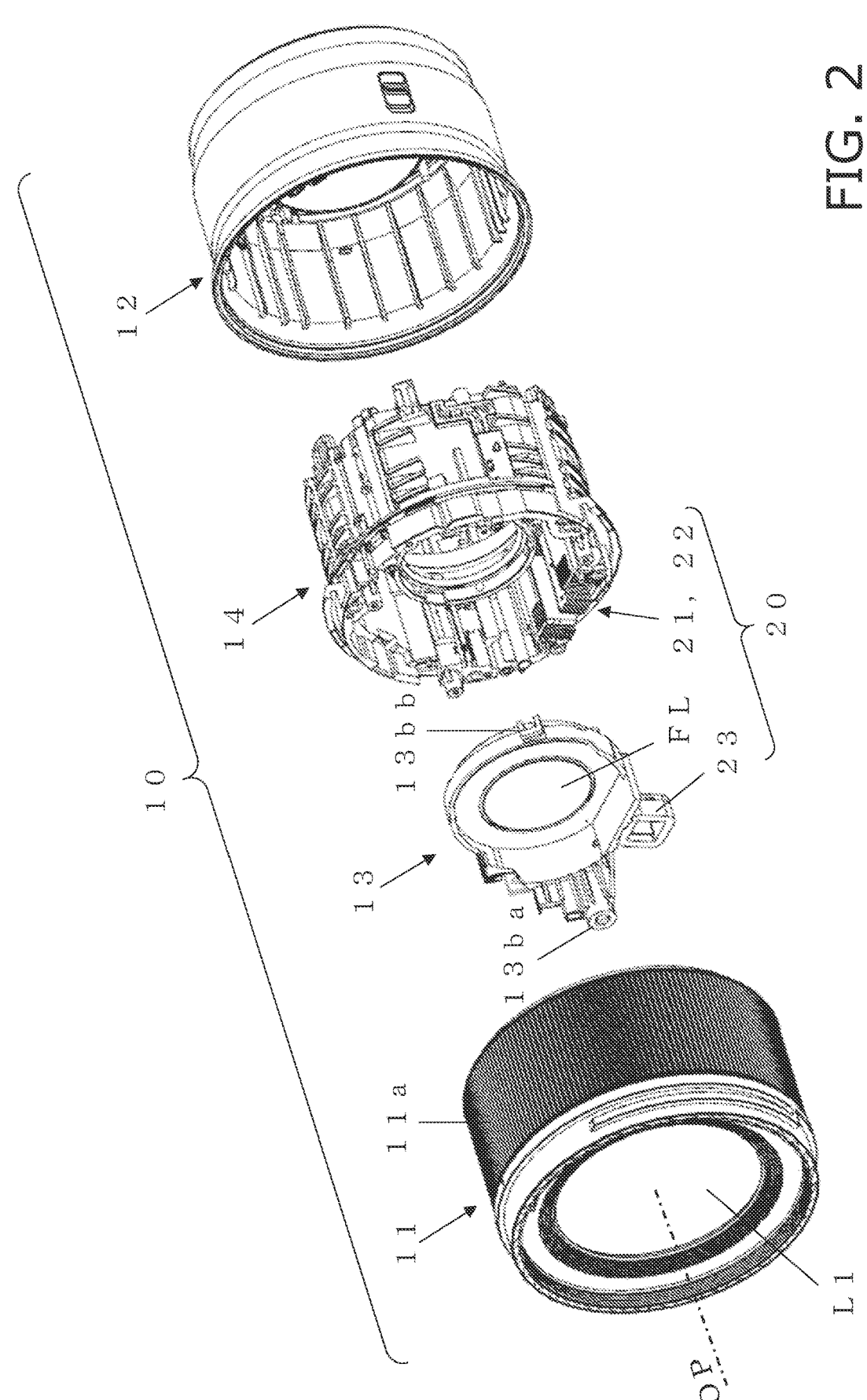
FIG. 2 is an exploded oblique view of the configuration of the lens barrel attached to the camera in FIG. 1.

As shown in FIG. 2, the lens barrel 10 mainly comprises a front frame unit 11, a rear frame unit 12, a focus lens unit (lens drive frame, lens drive device) 13, a fixing frame 14, a main shaft (first guide shaft) 15a, a secondary shaft (second guide shaft) 15b, and a voice coil motor (electromagnetic drive mechanism) 20.

As shown in FIG. 2, the front frame unit 11 is a substantially cylindrical member that forms the exterior portion of the lens barrel 10, and encompasses a plurality of lenses including the first lens group L1. Of the members constituting the lens barrel 10, the front frame unit 11 is disposed closest to the subject in the optical axis OP direction. The front frame unit 11 has a focus ring 11a that is rotatably attached to the substantially cylindrical outer surface.

As shown in FIG. 2, the rear frame unit 12 is a substantially cylindrical member that is attached to the end closest to the image plane side, out of the members constituting the lens barrel 10. The rear frame unit 12 constitutes the exterior portion of the lens barrel 10 along with the front frame unit 11. The end portion of the rear frame unit 12 is mounted to the mounting portion 52 provided on the main body portion 51 side of the camera main body 50. Consequently, with the camera 100 of this embodiment, the lens barrel 10 is removably attached to the camera main body 50.

Figure 3:
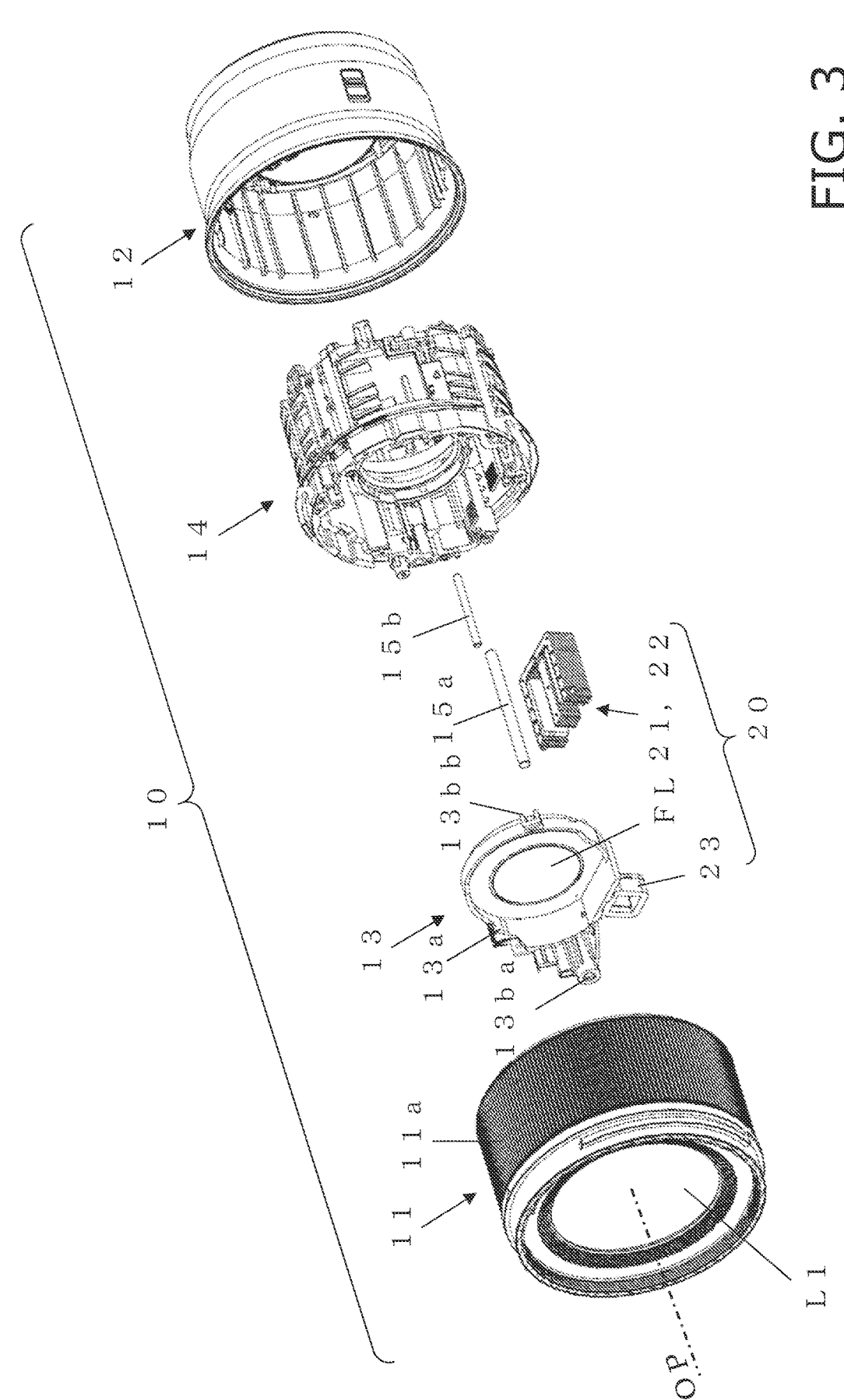
FIG. 3 is an exploded oblique view of the configuration of the magnetic drive mechanism, etc., housed inside the lens barrel in FIG. 2.

As shown in FIG. 2, the focus lens unit (lens drive frame, lens drive device) 13 holds a focus lens FL, and is driven back and forth in the optical axis OP direction by the lens drive device (discussed below). As shown in FIG. 3, the focus lens unit 13 has a main body 13a, an insertion hole 13ba into which the main shaft 15a (discussed below) is inserted in the optical axis OP direction, and an insertion hole 13bb into which the secondary shaft 15b is inserted in the optical axis OP direction.

The insertion hole 13ba is a through-hole that is formed substantially parallel to the optical axis OP direction in the main body 13a and into which the main shaft 15a is inserted, and the insertion hole 13ba is provided in the outer peripheral part of the focus lens unit 13. A gap is formed between the insertion hole 13ba and the outer peripheral surface of the main shaft 15a on the inner peripheral surface side.

The insertion hole 13bb is a through-hole that is formed substantially parallel to the optical axis OP direction in the main body 13a and into which the secondary shaft 15b is inserted, and is provided on approximately the opposite side from the insertion hole 13ba. The insertion hole 13ba functions as a stop that restricts the rotation of the focus lens unit 13 around the main shaft 15a when the secondary shaft 15b is inserted therein.

As shown in FIG. 2, the fixing frame 14 is a substantially cylindrical member provided on the inner peripheral surface side of the rear frame unit 12, and the voice coil motor 20, which constitutes the lens drive device (discussed below), is mounted on the inner peripheral surface side thereof.

The main shaft 15a is a guide shaft for moving the focus lens unit 13 back and forth in the optical axis OP direction, and is disposed in the optical axis OP direction. The first end on the subject side in the optical axis OP direction of the main shaft 15a is fixed to the front frame unit 11, and the second end on the image plane side is fixed to the fixing frame 14.

Here, a specific gap is formed between the outer peripheral surface of the main shaft 15a and the inner peripheral surface of the insertion hole 13ba so as not to hinder the smooth movement of the focus lens unit 13, as discussed above. Therefore, this gap could cause movement looseness of the focus lens unit 13 in a direction intersecting the optical axis OP direction.

With the lens barrel of this embodiment, because of the configuration of the lens drive device (discussed below), looseness is reduced by moving the focus lens unit 13 to one side in a specific direction.

The secondary shaft 15b is a guide shaft for restricting the rotation of the focus lens unit 13 around the main shaft 15a, and is disposed in the optical axis OP direction. Also, the first end of the secondary shaft 15b, on the subject side in the optical axis OP direction, is fixed to the front frame unit 11, and the second end on the image plane side is fixed to the fixing frame 14.

The voice coil motor (electromagnetic drive mechanism) 20 drives the focus lens unit 13 back and forth in the optical axis OP direction of the focus lens FL. As shown in FIGS. 2 and 3, the voice coil motor 20 includes a yoke 21 and magnet 22s that are fixed to the inner peripheral surface of the fixing frame 14, and an electromagnetic coil 23 that is attached to the outer peripheral part of the focus lens unit 13.

Also, the voice coil motor 20 is disposed below, in the vertical direction, a straight line connecting the main shaft 15a and the secondary shaft 15b (see the one-dot chain line in FIG. 7) when facing the camera main body 50 head on (see the broken line in FIG. 7, etc.).

Figure 4:
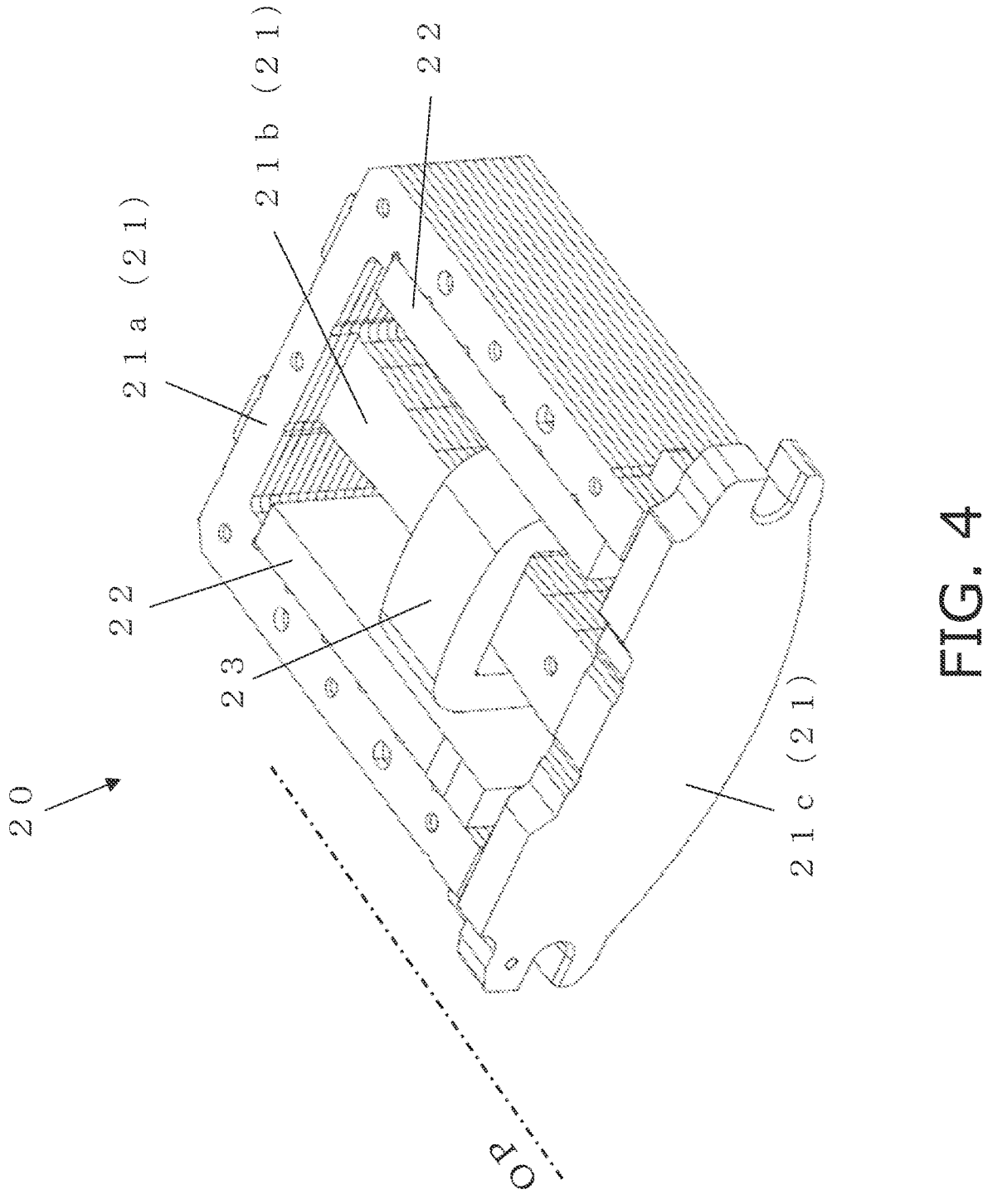
FIG. 4 is an oblique view of the configuration of the coil, magnet, and yoke included in the magnetic drive mechanism in FIG. 3.

Here, the voice coil motor 20 includes the yoke 21, the magnets 22, and the electromagnetic coil 23, as shown in FIG. 4.

The yoke 21 is made by punching out a laminate of iron sheet metal in a press. As shown in FIG. 4, the yoke 21 has a substantially U-shaped main yoke 21a, a center yoke 21b that is attached to the central portion of the substantially U-shaped main yoke 21a in parallel with the two arm portions of the main yoke 21a, and a sub-yoke 21c that is attached to the ends on the open side of the substantially U-shaped the main yoke 21a.

The magnets 22 are, for example, neodymium-based sintered magnets, each of which is unipolarly magnetized. As shown in FIG. 4, the magnets 22 are disposed inside the two arm portions of the substantially U-shaped main yoke 21a.

The electromagnetic coil 23 is attached to the focus lens unit 13, and when current is supplied from an FPC (flexible printed circuit board) 35 (discussed below), the magnetic force of the magnets 22 and a Lorentz force corresponding to the orientation of the current flowing to the electromagnetic coil 23 produce movement in the optical axis OP direction. That is, the electromagnetic coil 23 that is subjected to a Lorentz force when current is supplied is attached to the focus lens unit 13. Therefore, when the electromagnetic coil 23 is energized, the entire focus lens unit 13 to which the electromagnetic coil 23 is fixed can be moved in the optical axis OP direction. At this point, the direction in which the current flows through the electromagnetic coil 23 is switched, which switches the direction of the Lorentz force applied to the electromagnetic coil 23, and switches the direction in which the electromagnetic coil 23 (the focus lens unit 13) moves.

As mentioned above, the electromagnetic coil 23 is supplied with current from the FPC 35 (discussed below), and as shown in FIG. 4, is wound so as to cover part of the center yoke 21b of the yoke 21, and moves in the lengthwise direction of the center yoke 21b.

The lens barrel 10 also comprises a lens drive device (voice coil motor 20, etc.) that moves the focus lens unit 13 back and forth in the optical axis OP direction. The configuration of the lens drive device will be described in detail below.

(2) Configuration of Lens Drive Device

Figure 5:
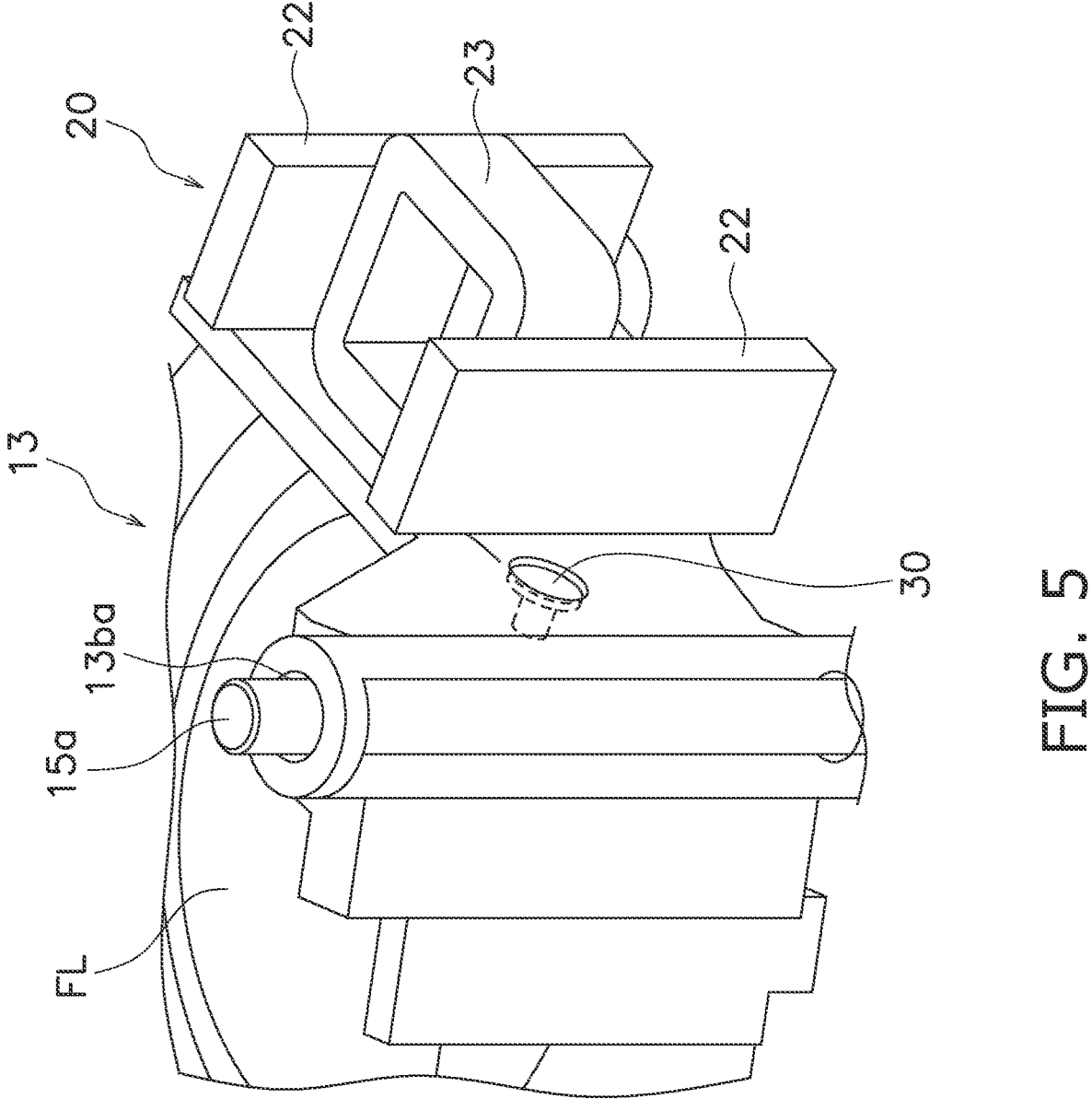
FIG. 5 is an oblique view of the positional relationship between the magnetic drive mechanism in FIG. 4 and a screw.

As shown in FIG. 5, the lens drive device according to this embodiment comprises the voice coil motor (electromagnetic drive mechanism) 20, the focus lens unit (lens drive frame) 13, the main shaft (first guide shaft) 15a, the insertion hole (first shaft support portion) 13ba, and the screw (magnetic material) 30.

The voice coil motor 20 has the magnets 22 and the electromagnetic coil 23, which is disposed so as to be able to move relative to the magnets 22.

The focus lens unit 13 holds the focus lens FL, has an electromagnetic coil 23 attached thereto, and is driven back and forth in the optical axis OP direction of the focus lens FL by the voice coil motor 20.

The main shaft 15a is disposed along the optical axis direction of the focus lens FL, and guides the focus lens unit 13 in its movement in the optical axis direction.

The insertion hole 13ba is provided to the focus lens unit 13, and the main shaft 15a is inserted therein.

The screw 30 is formed of a magnetic material, is provided to the focus lens unit 13, and is attracted in a specific direction together with the focus lens unit 13 by the magnetic force of the magnets 22. This suppresses any looseness of the focus lens unit 13 that may exist between the insertion hole 13ba and the main shaft 15a.

The attraction force with which the screw 30 is attracted to the magnets 22 is preferably, for example, at least 20% of the weight of the movable portion including the focus lens unit 13, multiplied by the gravitational acceleration.

The material used for the screw 30 can be, for example, carbon steel (carbon steel wire for cold forging). Alternatively, special materials such as silicon iron or permalloy can be used. Furthermore, it is possible to vary the magnitude of the biasing force with a given screw shape by performing an annealing treatment after working and thereby increasing the magnetic permeability.

Figure 6A:
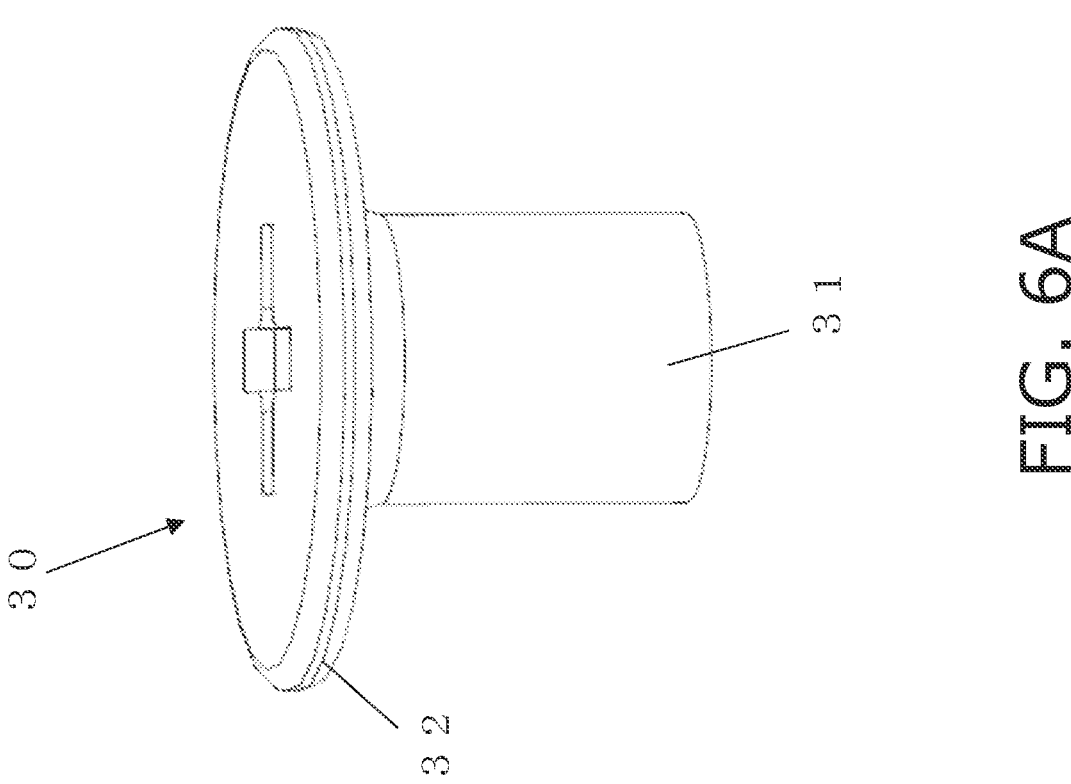
FIG. 6A is an oblique view of an example of the screw in FIG. 5.

The screw 30 is a magnetic material that is attracted by the magnetic force of the magnets 22 included in the voice coil motor 20, and has a threaded portion (adjustment mechanism) 31 and a flange portion 32, as shown in FIG. 6A.

As shown in FIG. 6A, the threaded portion 31 is a substantially cylindrical portion having threads formed around its outer surface, and is threaded into a screw hole having female threads formed on the outer surface of the focus lens unit 13, the result of which is that the screw 30 is fixed to the focus lens unit 13. The amount by which the threaded portion 31 is threaded into the focus lens unit 13 is adjusted, so that the threaded portion 31 functions as an adjustment mechanism for adjusting the distance between the threaded portion 31 (and particularly the flange portion 32) and the magnets 22 of the voice coil motor 20.

As shown in FIG. 6A, the flange portion 32 is a flange-shaped portion provided at one end of the substantially cylindrical threaded portion 31, and remains exposed on the outer surface of the focus lens unit 13 when the threaded portion 31 has been threaded into the focus lens unit 13.

The screw 30 that is attached to the focus lens unit 13 as a magnetic material allows the attraction force between the magnets 22 of the voice coil motor 20 to be adjusted according to how far the threaded portion 31 is thread, but the attraction force may be adjusted by some other method instead.

Figure 6B:
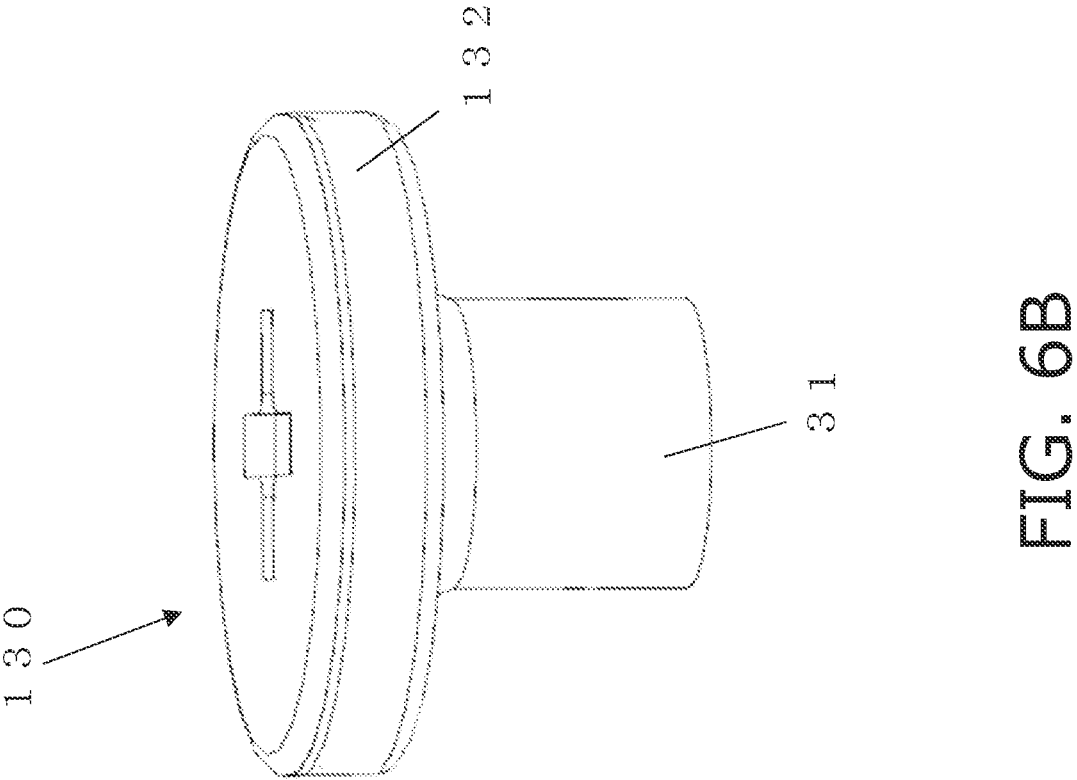
FIG. 6B is an oblique view of an example of a screw having a different shape from that in FIG. 6A.

For example, as shown in FIG. 6B, a screw 130 may be used in which the volume of the magnetic material is increased by increasing the thickness of the flange portion 132, and in which the attractive force with respect to the magnets 22 is increased more than with the screw 30 shown in FIG. 6A.

Figure 7:
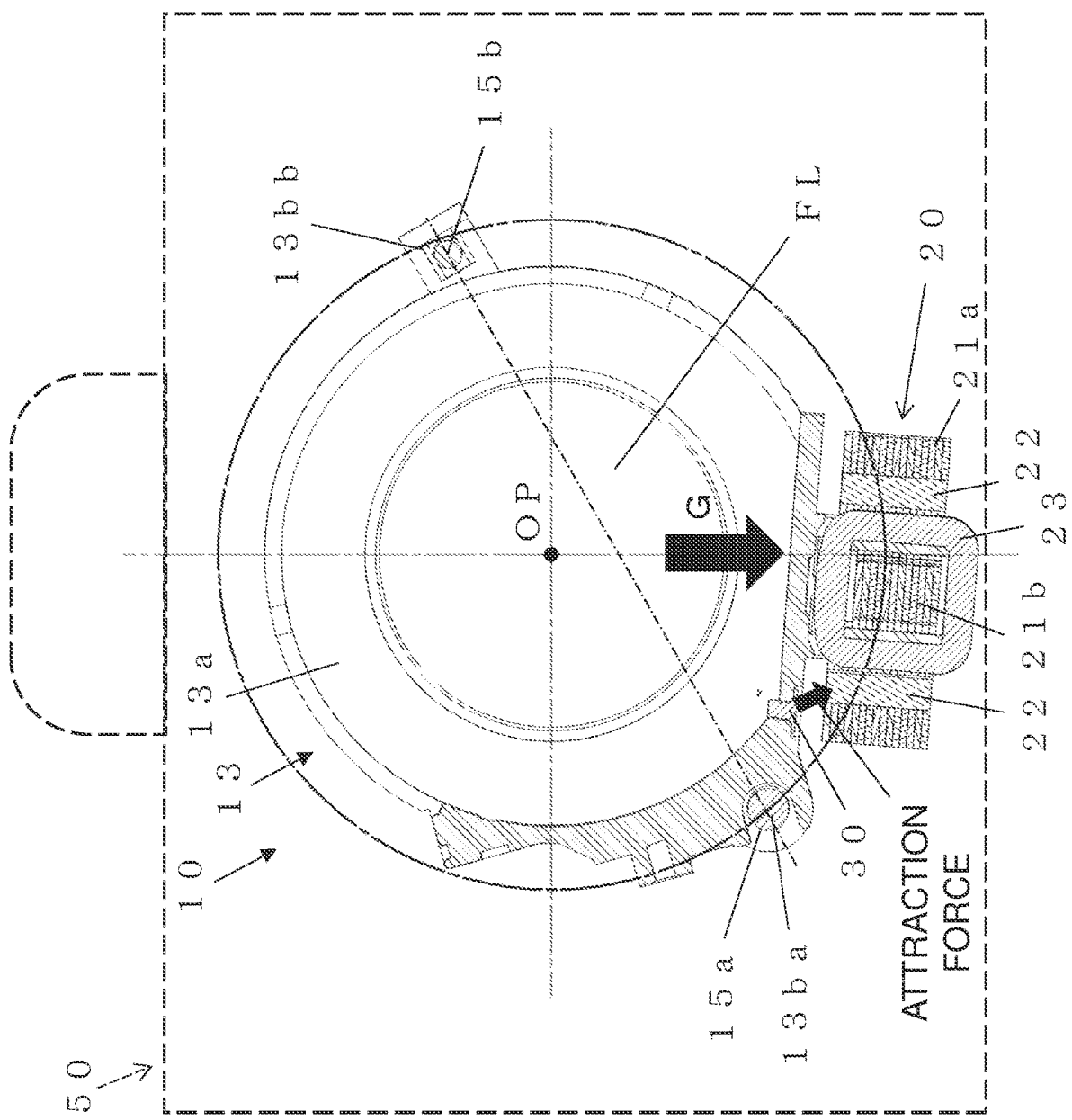
FIG. 7 is a front view, as seen in the optical axis direction, showing the direction of gravity and the direction of the magnetic force generated between the screw and the magnetic drive mechanism, related to the lens drive frame included in the lens barrel of FIG. 2.

Also, with the lens drive device of this embodiment, as shown in FIG. 7, the voice coil motor 20 is disposed below, in the vertical direction, the position where the screw 30 is provided in the focus lens unit 13 in an orientation facing the camera main body 50 (see the broken line in the drawing) straight ahead.

Consequently, as shown in FIG. 7, the direction in which gravity G is exerted on the focus lens unit 13 included in the lens barrel 10, and the direction in which the focus lens unit 13 (screw 30) is attracted to the magnets 22 of the voice coil motor 20 can be aligned in a direction facing substantially straight down.

Therefore, the focus lens unit 13 is driven back and forth in the optical axis OP direction in a state in which the inner peripheral surface of the insertion hole 13*ba* has been shifted in a substantially vertically downward direction with respect to the outer peripheral surface of the main shaft 15*a*, so looseness can be effectively suppressed.

Also, in this embodiment, the voice coil motor 20 is disposed below a straight line (see the one-dot chain line in the drawing) connecting the main shaft 15*a* and the secondary shaft 15*b* in the straight-ahead orientation (the orientation when taking a landscape photo with the camera) of the camera main body 50 (see the broken line in the drawing).

Consequently, the screw (magnetic material) 30 provided in order to attract the focus lens unit 13 vertically downward can be disposed more to the inner peripheral side than the voice coil motor 20.

Therefore, the lens barrel 10 can be driven back and forth in the optical axis OP direction while suppressing looseness between the focus lens unit 13 and the main shaft 15*a*, without increasing the size in the radial direction.

Figure 8:
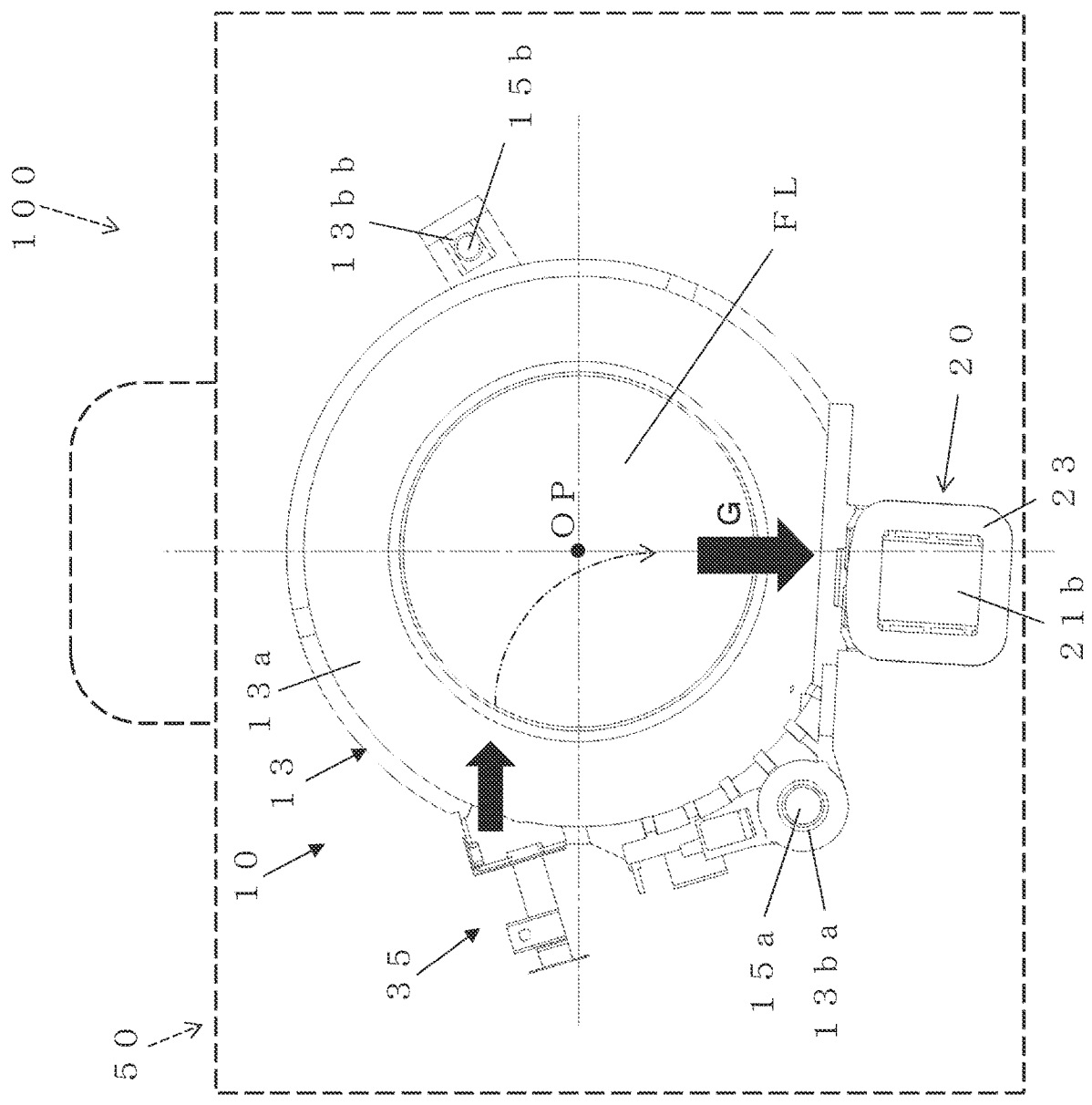
FIG. 8 is a front view, as seen in the optical axis direction, showing the direction of gravity and the direction of the biasing force exerted from the flexible printed circuit board onto the lens drive frame included in the lens barrel of FIG. 2.

Also, as shown in FIG. 8, the lens drive device of this embodiment comprises the FPC (flexible printed circuit board) 35 that supplies current to the electromagnetic coil 23 of the voice coil motor 20.

The FPC 35 is connected to the voice coil motor 20, supplies electric power to the electromagnetic coil 23, is disposed on the opposite side from the voice coil motor 20 so as to sandwich the main shaft 15*a*, and applies a biasing force inward in the radial direction centered on the optical axis OP of the focus lens FL.

As shown in FIG. 8, upon receiving the biasing force, the focus lens unit 13 is biased substantially parallel to the vertical direction and downward in the vertical direction toward a tangent to a circle centered on the main shaft 15*a* (see the dotted chain arc in the drawing).

Consequently, when the focus lens unit 13 is biased vertically downward, the direction in which gravity G is exerted on the focus lens unit 13 included in the lens barrel 10, and the direction in which the focus lens unit 13 (screw 30) is biased by the FPC 35 can be aligned in a direction facing substantially straight down.

Therefore, since the focus lens unit 13 can be shifted in the desired direction (substantially vertically downward), it can be driven back and forth in the optical axis OP direction while suppressing looseness between the focus lens unit 13 and the main shaft 15*a*.

OTHER EMBODIMENTS

An embodiment of the present disclosure was described above, but the present disclosure is not limited to the above embodiment, and various modifications are possible without departing from the gist of the disclosure.

(A)

In the above embodiment, an example was given in which looseness of the focus lens unit 13 was effectively suppressed by offsetting the focus lens unit 13 with respect to the main shaft 15*a* with a combination of the biasing force of the FPC 35 and the attraction force between the magnets 22 and the magnetic material (screw 30), facing downward in the same substantially vertical direction as the gravity G. However, the present disclosure is not limited to this.

For example, the configuration may involve using only one the attraction force between the magnetic material (screw 30) and the magnets 22 or the biasing force of the FPC 35.

More specifically, the directions of the attraction force between the magnetic material (screw or the like) and the magnets and of gravity may be substantially the same. Alternatively, the configuration may be such that directions of the biasing force produced by the flexible printed circuit board (FPC) and of gravity are substantially the same.

In any case, the same effect can be obtained as in the above embodiment.

(B)

In the above embodiment, an example was given in which the voice coil motor 20 drove the focus lens unit 13 back and forth in the optical axis OP direction by using two guide shafts (first and second guide shafts), namely, the main shaft 15*a* and the secondary shaft 15*b*. However, the present disclosure is not limited to this.

For example, there may be just one guide shaft for guiding the lens drive frame (focus lens unit) back and forth in the optical axis direction, or there may be three or more.

(C)

In the above embodiment, as shown in FIG. 7, etc., an example was given in which the voice coil motor 20 was disposed near the main shaft 15*a*, out of the main shaft 15*a* and the secondary shaft 15*b* that are disposed at positions opposite each other on the outer peripheral side of the focus lens unit 13. However, the present disclosure is not limited to this.

For example, the electromagnetic drive mechanism (voice coil motor) may be disposed closer to the second guide shaft (secondary shaft) than the first guide shaft (main shaft).

(D)

In the above embodiment, an example was given in which the focus lens unit 13 was used as the lens drive frame. However, the present disclosure is not limited to this.

For example, the present disclosure may be applied to another lens drive frame that holds a lens other than a focus lens (such as a zoom lens) and that is driven back and forth in the optical axis direction.

(E)

In the above embodiment, an example was given in which the distance between the magnets 22 of the voice coil motor 20 and the screw 30 was adjusted by adjusting the amount by which the screw 30 provided as a magnetic material was threaded in, thereby adjusting the mutual attraction force. However, the present disclosure is not limited to this.

For example, some other means may be used as the mechanism for adjusting the attraction force between the magnets and the magnetic material, such as replacing the magnetic material with one having a different size, shape, or the like, instead of adjusting the amount in which the screw is threaded in.

Figure 9:
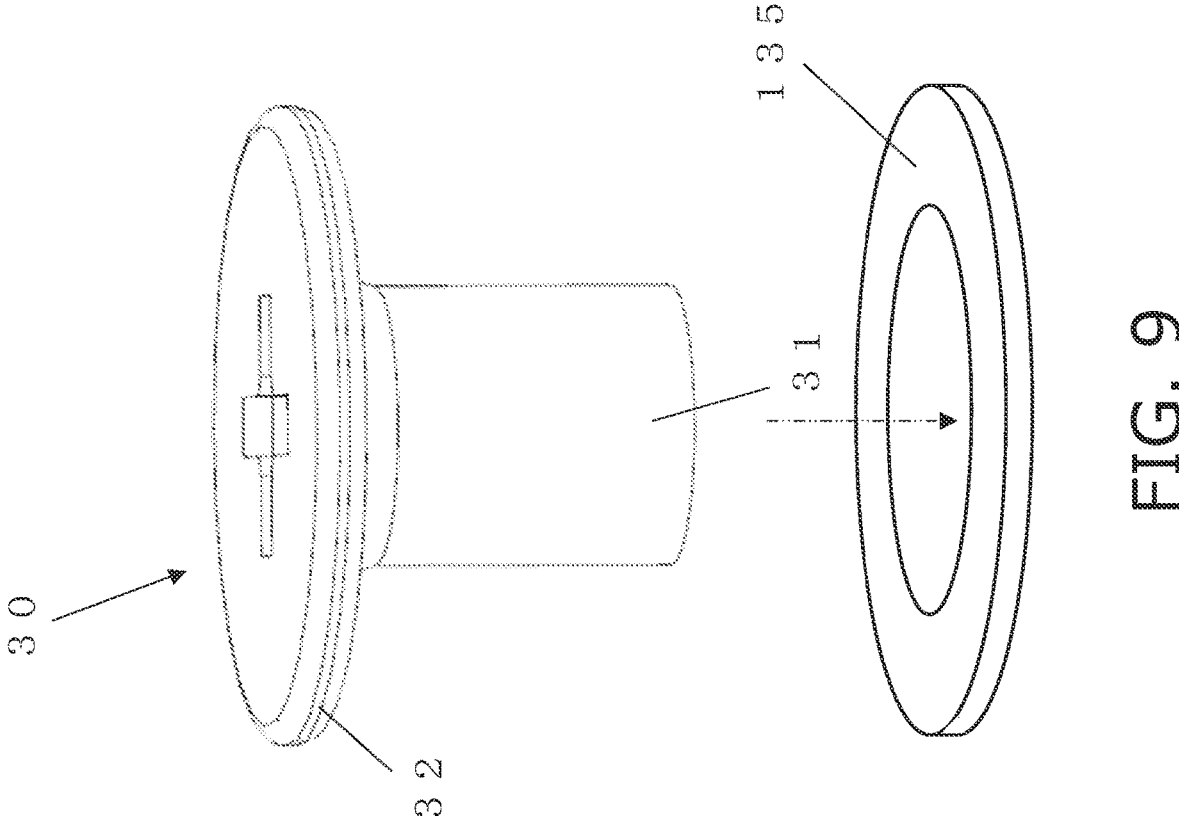
FIG. 9 is a diagram showing another example of the magnetic material included in the lens drive device according to another embodiment of the present disclosure.

Also, in a configuration in which a screw is used as a magnetic material, as shown in FIG. 9, the configuration may be such that the attraction force is adjusted by adding a third component such as a washer 135 between the screw 30 and the outer peripheral surface of the focus lens unit 13.

INDUSTRIAL APPLICABILITY

The lens drive device of the present disclosure exhibits the effect of suppressing looseness in a lens drive frame, without making the lens barrel larger, and as such is widely applicable to lens drive devices that are installed in lens barrels and other such optical devices.

REFERENCE SIGNS LIST 10 lens barrel
11 front frame unit
11a focus ring
12 rear frame unit
13 focus lens unit (lens drive frame, lens drive device)
13a main body portion
13ba insertion hole (first shaft support portion)
13bb insertion hole (second shaft support portion)
14 fixing frame
15a main shaft (first guide shaft, lens drive device)
15b secondary shaft (second guide shaft, lens drive device)
20 voice coil motor (electromagnetic drive mechanism, lens drive device)
21 yoke
21a main yoke
21b center yoke
21c sub-yoke
22 magnet
23 electromagnetic coil
30 screw (magnetic material, lens drive device)
31 threaded portion (adjustment mechanism, lens drive device)
32 flange portion
35 FPC (flexible printed circuit board, lens drive device)
50 camera main body
51 main body portion
52 mounting portion
53 image sensor
100 camera
130 screw (magnetic material)
132 flange portion
135 washer
L1 first lens group
OP optical axis

The invention claimed is:

1. A lens drive device, comprising:
an electromagnetic drive mechanism that has a magnet and an electromagnetic coil that is disposed in a state of being capable of moving relative to the magnet;
a lens drive frame that holds a lens, that has the electromagnetic coil mounted thereto, and that is configured to be driven back and forth along an optical axis direction of the lens by the electromagnetic drive mechanism;
a first guide shaft that is disposed along the optical axis direction of the lens and is configured to guide the lens drive frame in its movement in the optical axis direction;
a first shaft support portion that is provided to the lens drive frame and into which the first guide shaft is inserted; and
a magnetic material that is provided to the lens drive frame, and is configured to suppress looseness of the lens drive frame that occurs between the first shaft support portion and the first guide shaft by being attracted together with the lens drive frame in a specific direction by a magnetic force of the magnet,
wherein the electromagnetic drive mechanism is disposed below a position where the magnetic material is provided in the lens drive frame in a vertical direction, and the magnetic material is a screw that threads into the lens drive frame.

2. The lens drive device according to claim 1, further comprising:
a second guide shaft that is disposed along the optical axis direction of the lens and is configured to guide the lens drive frame in the optical axis direction; and
a second shaft support portion that is formed on the lens drive frame and into which the second guide shaft is inserted.

3. The lens drive device according to claim 2,
wherein the electromagnetic drive mechanism is below a straight line connecting the first shaft support portion and the second shaft support portion in the lens drive frame.

4. The lens drive device according to claim 1,
further comprising a flexible printed circuit board that is configured to supply power to the electromagnetic coil.

5. The lens drive device according to claim 4,
wherein the flexible printed circuit board is disposed on an opposite side of the electromagnetic drive mechanism so as to sandwich the first guide shaft, and exerts a force that biases the lens drive frame inward in a radial direction centered an optical axis of the lens, and
upon receiving a biasing force, the lens drive frame is biased in a tangential direction of a circle centered on the first guide shaft, substantially parallel to the vertical direction.

6. The lens drive device according to claim 1,
wherein the electromagnetic drive mechanism has a drive coil held by the lens drive frame, and a drive magnet configured to apply an interlinked magnetic field to the drive coil.

7. The lens drive device according to claim 1,
wherein the magnetic material has an adjustment mechanism configured to adjust a distance from the electromagnetic drive mechanism.

8. The lens drive device according to claim 1,
wherein the magnetic material includes the screw and a washer that is fixed between the lens drive frame and the screw.

9. A lens barrel, comprising:
the lens drive device according to claim 1; and
a fixing frame to which a magnet included in the electromagnetic drive mechanism is fixed.

10. A camera, comprising:
the lens barrel according to claim 9; and
a camera main body to which the lens barrel is attached.

11. A lens drive device, comprising:
an electromagnetic drive mechanism that has a magnet and an electromagnetic coil that is disposed in a state of being capable of moving relative to the magnet;
a lens drive frame that holds a lens, that has the electromagnetic coil mounted thereto, and that is configured to be driven back and forth along an optical axis direction of the lens by the electromagnetic drive mechanism;
a first guide shaft that is disposed along the optical axis direction of the lens and is configured to guide the lens drive frame in its movement in the optical axis direction;
a first shaft support portion that is provided to the lens drive frame and into which the first guide shaft is inserted; and
a flexible printed circuit board that is configured to supply electric power to the electromagnetic coil, is disposed on an opposite side of the electromagnetic drive mechanism so as to sandwich the first guide shaft, and is configured to exert a force that biases the lens drive frame inward in a radial direction centered an optical axis of the lens, wherein, upon receiving a biasing force, the lens drive frame is biased downward in a vertical direction in a tangential direction of a circle centered on the first guide shaft, substantially parallel to the vertical direction.

12. The lens drive device according to claim 11, further comprising a magnetic material that is provided to the lens drive frame and is configured to suppress looseness of the lens drive frame that occurs between the first shaft support portion and the first guide shaft by being attracted together with the lens drive frame in a specific direction by a magnetic force of the magnet.

13. A lens barrel, comprising:

the lens drive device according to claim 11; and a fixing frame to which a magnet included in the electromagnetic drive mechanism is fixed.

14. A camera, comprising:

the lens barrel according to claim 13; and a camera main body to which the lens barrel is attached.

* * * * *